United States Patent
Yang et al.

(10) Patent No.: US 6,323,795 B1
(45) Date of Patent: Nov. 27, 2001

(54) ELECTRONIC DIGITAL-TO-ANALOG CONVERTER CIRCUIT FOR A BASEBAND TRANSMISSION SYSTEM

(75) Inventors: Fuji Yang, Clichy; Arnaud Maecker, Asnieres, both of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/457,693

(22) Filed: Dec. 9, 1999

(30) Foreign Application Priority Data

Dec. 14, 1998 (FR) .................................................. 98 15743

(51) Int. Cl.[7] .................................................. H03M 3/00
(52) U.S. Cl. ........................ 341/143; 341/144; 364/724.1
(58) Field of Search .................................. 341/143, 120, 341/144, 117, 110, 128, 129, 145; 364/724.1

(56) References Cited

U.S. PATENT DOCUMENTS

| | | | |
|---|---|---|---|
| 5,212,659 | * | 5/1993 | Scott et al. ........................ 364/724.1 |
| 5,248,970 | * | 9/1993 | Sooch et al. .......................... 341/120 |
| 5,489,903 | * | 2/1996 | Wilson et al. ........................ 341/144 |
| 5,541,864 | * | 7/1996 | Van Bavel et al. ................ 364/724.1 |
| 5,712,635 | * | 1/1998 | Wilson et al. ........................ 341/144 |

FOREIGN PATENT DOCUMENTS 0 642 221 A    3/1995  (EP) .

* cited by examiner

*Primary Examiner*—Brian Young
*Assistant Examiner*—John Nguyen
(74) *Attorney, Agent, or Firm*—Sughrue, Mion, Zinn, Macpeak & Seas, PLLC

(57) ABSTRACT

The invention relates to an electronic circuit for solving problems of phase linearity involved with transmitting a signal through a digital-to-analog converter module. By connecting the following in cascade: an interpolator; a sigma-delta modulator; a digital-to-analog converter block made up of a 1-bit digital-to-analog converter and a multi-band finite impulse response filter; and an analog filter, it is possible to filter out quantization noise while providing a linear response at the output from the circuit.

7 Claims, 2 Drawing Sheets

ELECTRONIC DIGITAL-TO-ANALOG CONVERTER CIRCUIT FOR A BASEBAND TRANSMISSION SYSTEM

The present invention relates to an electronic digital-to-analog converter circuit for a baseband transmission system.

BACKGROUND OF THE INVENTION

More particularly, the invention relates to an electronic digital-to-analog converter circuit for transforming a digital signal into an analog signal without phase distortion, and in particular a circuit comprising a sigma-delta type modulator and a filter having a finite impulse response.

A preferred field of application of the invention is the field of mobile telephony. The invention is described essentially in the context of this field. Nevertheless, the scope of the invention should not be limited to the field of mobile telephony, but should be understood as extending to any other field in which the converter circuit and the method of conversion of the invention are applied.

In general, a mobile telephone or a cordless telephone can be structurally subdivided into four distinct blocks: the user block or user interface; the control block; the audio block; and the radio frequency block. The last three blocks to be mentioned constitute the radio unit of the mobile telephone.

FIG. 1 is a block diagram showing the general structure 100 of a mobile telephone. The general structure 100 has four main blocks as mentioned above. The user of a mobile telephone has access to a user interface 120. The user interface 120 generally comprises a loudspeaker 121, a microphone 122, a keypad 123, and display means 124. The user interface 120 can optionally include other elements, for example a modem for transferring data.

A radio unit 130 comprises the blocks that are required for baseband transmission: speech encoding means; means for compressing information into data blocks; and means for decompressing such data blocks into a continuous signal. These elements, and others, are shared between a control block 140, an audio block 150, and a radio frequency block 160.

The control block 140 comprises a microprocessor 141 which acts as a central processor unit. The microprocessor 141 performs the procedures necessary for setting up a call. It also controls the various operations of the mobile telephone by means of various programs. These programs include, for example, programs for managing the user interface 120, monitoring programs (in particular for monitoring battery level), and test programs in order to facilitate maintenance of the mobile telephone. Other programs manage the connection between the mobile telephone and the nearest transmission relay. The programs associated with the user interface 120 manage, in particular, interactions between the user and the other programs, in particular by interpreting the information provided by the user to the microprocessor 141 via the digital keypad 123 and a link 101, and by controlling the display means 124 via a link 102.

The control block 140 also has memories 142 which are used in mobile telephones for storing, in particular, the operating system, the serial number, and the telephone number associated with the mobile telephone, or indeed rights to use various services. These memories 142 can also be used when setting up a call. Data information, memory addresses, and commands are interchanged between the memories 142 and the microprocessors 141 over a bidirectional bus 103.

The audio block 150 is essentially constituted by a signal processor unit 151 which makes use of numerous programs. The signal processor unit 151 receives information from the microphone 122 over a link 104. A link 105 serves to transmit signals between the signal processor unit 151 and the loudspeaker 121. Information is also interchanged between the signal processor unit 151 and the microprocessor 141 over a bidirectional link 106.

Communication with the radio unit 130 of the mobile telephone takes place by means of a special radio frequency interface 160 in which analog-to-digital and digital-to-analog conversions are performed. The radiofrequency block 160 comprises, in particular: an antenna 161 connected to a duplexer 162; a transmitter 163; a receiver 164; and a frequency generator unit 165. The microprocessor 141 manages the operation of the transmitter 163, the receiver 164, and the frequency generator 165 over respective connections 107, 108, and 109. The signal processor unit 151 can send signals to the transmitter 163 and can receive signals from the receiver 164 over respective links 110 and 111. The frequency generator 165 is connected to the transmitter 163 and to the receiver 164 over respective connections 112 and 113. The duplexer 162 receives signals from the transmitter 163 over a link 114 and sends signals to the receiver 164 over a link 115.

In the transmitter 163, signals carrying speech information and other information as required for telecommunication are modulated for transmission by means of a radiofrequency carrier wave. Modulation operations are usually performed at an intermediate frequency which is mixed with the desired transmission frequency. Various methods of modulation are known. They depend on the type of signal and on the equipment available for transmission. To transmit analog information, it is possible to use frequency modulation or frequency shift keying (FSK). To transfer digital information, it is possible to use phase shift keying (PSK) e.g. of the $\pi/4$ PSK type, or to use Gaussian minimum shift keying (GMSK).

FIG. 2 is a simplified block diagram of a transmission system for the transmitter 163, and more particularly of a prior art digital-to-analog converter circuit. The signal coming from the signal processor unit 151 is sent in the form of digital data to an interface 210 of the transmitter 163. The signal received by the transmitter 163 is processed in succession by the interface 210, by a modulator 220 performing GMSK type modulation, by a digital-to-analog converter 240 (DAC), by a sample-and-hold circuit 230, and by an analog filter 250.

In the prior art, for reasons to do with energy consumption and with ease of implementation, the DAC 240 is usually a switched-capacitor DAC. Thus, for example, each group of k bits from the modulator 220 produces a voltage that is proportional to the value encoded on the k bits directly at the output from the DAC 240. That method gives rise to problems of linearity between the signal from the DAC 240 and the signal input to the DAC 240. These problems of linearity are made worse by the fact that there is a sample-and-hold circuit 230 in the above-described transmission system. The DAC 240 is a switched-capacitor digital-to-analog converter. This means that for a half-period of a cyclic clock signal controlling the transfer of data along the above-described transmission system, the values of the bits processed by the DAC 240 are not available. The sample-and-hold circuit 230 is therefore required to maintain each processed bit value for at least one half-period of the clock signal. The presence of the sample-and-hold circuit 230 nevertheless increases problems of non-linearity in the transmission of the signal. In certain transmitters, and in particular in transmitters used in GSM type mobile telephone systems, the distortion of the transmitted signal can be very detrimental to the quality of the call.

The prior art, in particular patent EP A-0642221, describes an electronic digital-to-analog converter circuit for a baseband transmission system. The circuit includes an interpolator for increasing a sampling frequency of the digital signal, a sigma-delta type modulator, a digital-to-analog converter block comprising a finite impulse response filter (FIR), and finally an analog filter of lowpass filter type.

However, the FIR described in that document is a conventional FIR, i.e. having a transfer function of the type $h(z)=1+a_1z^{-1}+a_2z^{-2}+a_3z^{-3}+\ldots$. Such a filter is not adapted to an application in the GSM field since it would require a large number of coefficients $a_1$ resulting in an FIR of large volume and of high electricity consumption in order to obtain a filter having a steep slope.

OBJECTS AND SUMMARY OF THE INVENTION

The present invention makes it possible to mitigate the above-described drawbacks of prior art systems and, in particular, to obtain a steeply-sloped filter that is smaller than that of digital-to-analog converters of the prior art.

The present invention provides an electronic digital-to-analog converter circuit for a baseband transmission system to transform a digital signal into an analog signal without phase distortion, the system comprising:

a digital modulator delivering a signal in the form of groups of n bits;

an interpolator for increasing a sampling frequency of the digital signal;

a sigma-delta type modulator for transforming an n-bit signal into a 1-bit signal;

a digital-to-analog converter block, specifically for filtering out quantization noise in sharp manner, which block comprises a digital-to-analog converter and a finite impulse response filter; and an analog filter of lowpass filter type, wherein the finite impulse response filter is a multiband filter.

BRIEF DESCRIPTION OF THE DRAWINGS

Various aspects and advantages of the invention appear more clearly from the following description given with reference to the accompanying figures which are given purely by way of non-limiting indication of the invention, and in which.

MORE DETAILED DESCRIPTION

Figure 1:
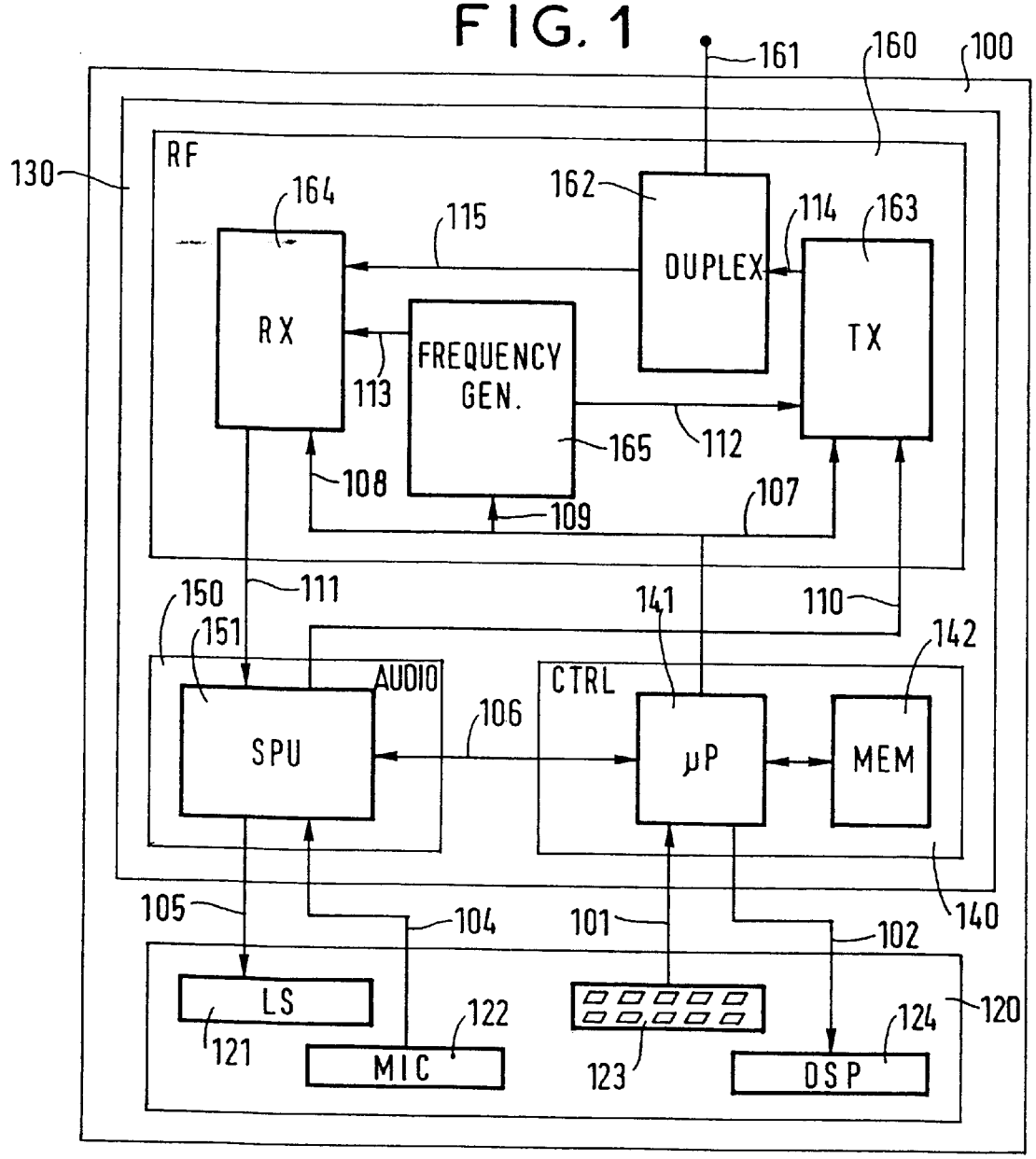
FIG. 1, described above, is a block diagram shown the general structure of a mobile telephone.
Figure 2:
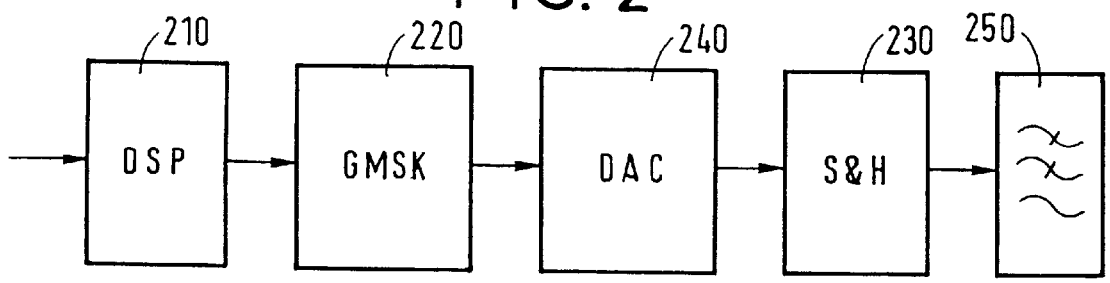
FIG. 2, described above, is a block diagram of a prior art electronic digital-to-analog converter circuit.
Figure 3:
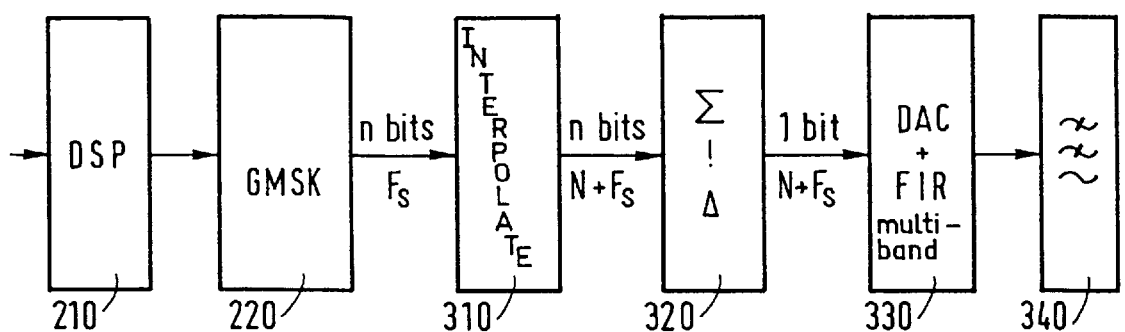
FIG. 3 is a block diagram of an electronic circuit of the invention.

In FIG. 3, there can be seen the interface 210 which receives the signal from the signal processor unit 151 and which is already present in the prior art transmission system shown in FIG. 2. There can also be seen the GMSK type modulator 220. The signal from the modulator 220 is processed in succession by the following elements: an interpolator 310; a sigma-delta type modulator 320; a digital-to-analog converter block 330; and finally an analog filter 340. The function of each of these elements is described in greater detail below.

Figure 4:
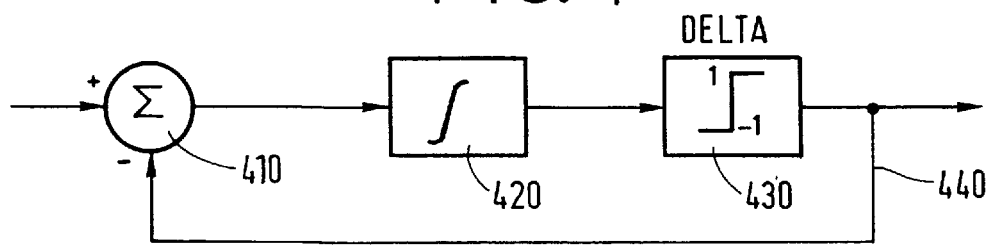
FIG. 4 is a block diagram of a sigma-delta modulator.

The modulator 320 is known as a sigma-delta modulator. FIG. 4 is a block diagram of such a modulator. The term "sigma-delta" comes from the configuration of the modulator which makes use firstly of an adder 410, as conventionally symbolized by the Greek letter "sigma". The output from the adder 410 is connected to an integrator 420 which integrates the signal. The integrator 420 acts as a lowpass filter for the payload input signal. The integrator 420 is followed by a quantizer 430 operating on the principle of performing quantization as the result of taking the difference between two consecutive samples of the processed digital signal. It is from this difference that the term "delta" arises, in line with the common name for such an operation. A negative feedback loop 440 acts as a highpass filter for quantization noise as generated by the quantizer 430. The sigma-delta type modulator makes it possible to reject quantization noise into high frequencies while the payload signal is present in the low frequencies.

In digital-to-analog converter systems comprising a sigma-delta type modulator, the sampling frequency is initially increased. In this case, this operation is performed by the interpolator 310. The interpolator makes it possible to perform an oversampling operation.

In a preferred application of the invention, the frequency at which the data from the GSMK type modulator is sampled is doubled by performing linear type interpolation: between two consecutive data groups from the GMSK type modulator 220, an additional data group is added corresponding to the mean of two data groups that are directly adjacent in time. The sampling frequency is then tripled at the input to the sigma-delta type modulator by repeating each data group three times.

The interpolator 310 thus makes it possible to go from an n-bit signal sampled at a frequency Fs to an n-bit signal sampled at a frequency N×Fs where N is a natural integer. In a preferred application N=6 and n=8.

The sigma-delta type modulator 320 associated with the interpolator 310 makes it possible to go from an n-bit signal sampled at the frequency N×Fs to a 1-bit signal sampled at the frequency N×Fs.

The 1-bit signal delivered by the sigma-delta modulator 320 can be a signal that is pulse duration modulated (PDM). It is supplied to the input of the digital-to-analog block. The output signal from the sigma-delta modulator 320 thus supplies the digital-to-analog converter block 330 with less information since the number of bits has been reduced, however it does so at a frequency that is higher because of the oversampling performed by the interpolator 310.

The quantization noise generated at the output from the sigma-delta type modulator is large since the signal is now coded on a single bit. The digital-to-analog converter block 330 serves to filter this quantization noise. The digital-to-analog converter block 330 is constituted by a 1-bit digital-to-analog converter, or 1-bit DAC, and by a filter having finite impulse response.

The output from the 1-bit DAC activates the finite impulse response filter that follows it. The FIR has current sources. Each bit input to the 1-bit DAC controls a current source after processing that makes use in particular of shift registers. Each current source is associated with a respective coefficient of the finite impulse response filter. Each current source delivers current that is proportional to a corresponding one of the coefficients of the FIR.

By using a 1-bit DAC as in the case of the present invention, it is possible to solve problems of non-linearity associated with the signal being transmitted through the digital-to-analog conversion system.

However, in order to filter out the high level of quantization noise, the finite impulse response filter must have a cutoff frequency close to the baseband frequency (typically 100 kHz for use in a GSM context). This means that the graphical representation of the transfer function of the FIR filter must have a slope that is very steep around 100 kHz. Unfortunately, this can be achieved only by using a conventional FIR filter that is complex, and consequently that has a large number of coefficients. This would increase the number of current sources required. Such a solution would increase consumption of electrical energy during signal transmission, and would occupy a larger volume.

In the invention, the finite impulse response filter is a multiband filter. An advantage of the FIR is that of eliminating all frequencies close to the signal without deteriorating phase, as shown by the 4th spectrum in FIG. 5 where the quantification noise 530 is filtered for the frequencies adjacent to the signal, while also having the advantage of being much smaller than a conventional FIR.

In addition, a multiband FIR filter is a filter that is easy to implement because its number of coefficients is small, and consequently it requires only a small number of current sources. It presents the characteristics of having a transfer function whose graphical representation has a steep slope at a low frequency, while allowing higher frequencies to pass in a manner that is periodic.

The higher frequencies which are not filtered by the multiband FIR filter are filtered by means of a simple lowpass filter, such as the analog filter 340 of FIG. 3.

The presence of the multiband FIR filter also makes it possible to avoid having a complex analog filter in the signal transmission system, given that such a filter would be liable to introduce phase distortion.

Figure 5:
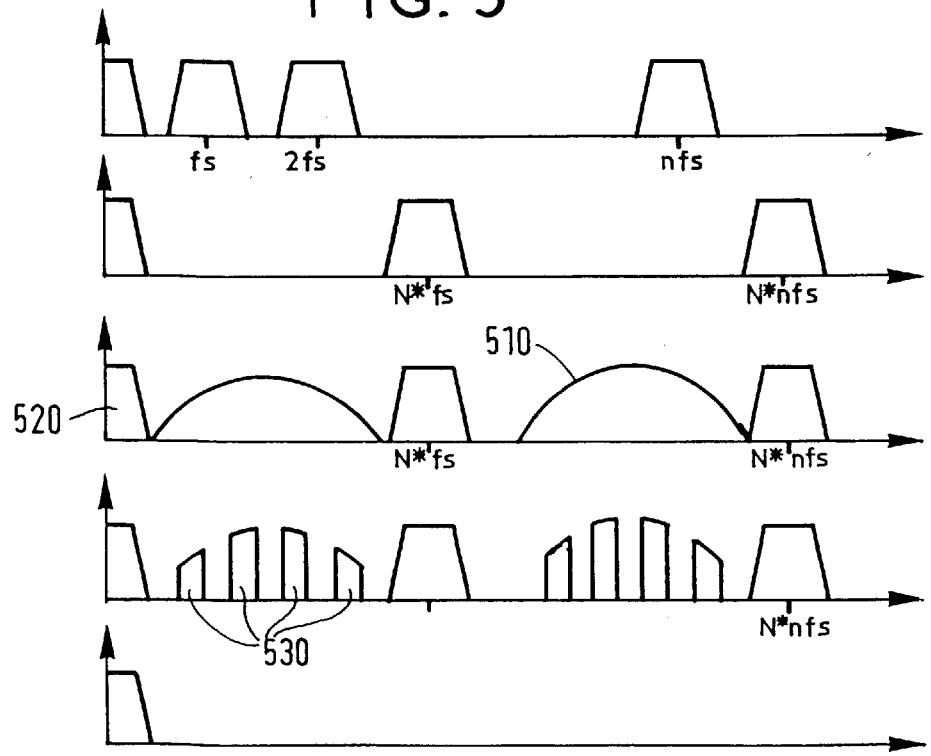
FIG. 5 shows the frequency spectra of the signal as conveyed at various points in the electronic circuit of the invention while a signal is passing therethrough.

FIG. 5 shows the frequency spectra of the transmitted signal at various points in the electronic circuit of the invention.

On inspecting FIG. 5 from top to bottom, the five frequency spectra shown are those observed respectively: at the input to the interpolator 210; at the output from the interpolator 210; at the output from the sigma-delta modulator 320; at the output from the digital-to-analog converter block 330; and at the output from the analog filter 340.

It can clearly be seen from the frequency spectrum of the signal output by the sigma-delta modulator 320, that the frequency spectrum 510 representing quantization noise is rejected into frequencies that are high relative to the frequency spectrum 520 of the payload signal. In the frequency spectrum of the signal output by the digital-to-analog converter block, it can be seen that the multiband FIR filter of the invention allows frequency bands 530 to pass through, and that consequently quantization noise is not filtered out completely, however all the frequencies thereof that are immediately adjacent to the frequencies of the payload signal are indeed filtered out.

The following analog filter 340 can thus be a filter that is easy to implement. The electronic circuit of the invention is economical in terms of volume required for physical implementation.

In the prior art, compensation circuits are used after the signal has been transformed into an analog signal. The presence of compensation circuits in the digital portion would require bits to be added to the signal to be processed, and that would consequently exacerbate problems of linearity in terms of signal transmission.

In a preferred application of the invention, the sigma-delta type modulator has a transfer function $h_1(z)=1-2z^{-1}+z^{-2}$.

In a preferred application of the invention, the transfer function of the FIR filter is:

$h_2(z)=-1+z^{-14}+2.74z^{-21}+4.85z^{-28}+5.76z^{-35}+4.85z^{-42}+2.74z^{-49}+z^{-57}-z^{-71}$.

Under such circumstances, the FIR filter has only nine coefficients. Consequently it is clear that it is simple to implement. Such a filter also has the advantage of being economical in terms of the volume required for being physically implemented.

What is claimed is:

1. An electronic digital-to-analog converter circuit for a baseband transmission system to transform a digital signal into an analog signal without phase distortion, the electronic digital-to-analog converter circuit comprising:

a digital modulator delivering an n-bit digital signal having a sampling frequency $F_s$;

an interpolator for receiving the n-bit digital signal from the digital modulator and increasing the sampling frequency $F_s$ of the digital signal by a factor N to generate an n-bit digital signal having a sampling frequency $N \times F_s$;

a sigma-delta type modulator for receiving n-bit digital signal having the sampling frequency $N \times F_s$ and transforming the n-bit digital signal having the sampling frequency $N \times F_s$ into a 1-bit signal having the sampling frequency $N \times F_s$;

a digital-to-analog converter unit for receiving the 1-bit digital signal having the sampling frequency $N \times F_s$ from the sigma-delta type modulator, converting the 1-bit digital signal into an analog signal and filtering out quantization noise, the digital-to-analog converter unit comprising a digital-to-analog converter and a multiband finite impulse response filter; and an analog filter of lowpass filter type for receiving the analog signal and low pass filtering the analog signal.

2. An electronic circuit according to claim 1, wherein the digital-to-analog converter is a 1-bit digital-to-analog converter delivering a pulse duration modulated signal.

3. An electronic circuit according to claim 1, wherein the finite impulse response filter comprises current sources delivering currents that are proportional to coefficients defining the filter.

4. An electronic circuit according to claim 1, wherein the sigma-delta type modulator has the following transfer function:

$h_1(z)=1-2z^{-1}+z^{-2}$.

5. An electronic circuit according to claim 2, wherein the finite impulse response filter has the following transfer function:

$h_2(z)=-1+z^{-14}+2.74z^{-21}+4.85z^{-28}+5.76z^{-35}+4.85z^{-42}+2.74z^{-49}+z^{-57}-z^{-71}$.

6. An electronic circuit according to claim 1, wherein the interpolator multiplies the sampling frequency by six.

7. The use of the digital-to-analog converter circuit according to claim 1 in a mobile telephone.

* * * * *